US010916738B2

(12) United States Patent
Sun et al.

(10) Patent No.: US 10,916,738 B2
(45) Date of Patent: Feb. 9, 2021

(54) DISPLAY PANEL AND MANUFACTURING METHOD OF THE DISPLAY PANEL, DISPLAY DEVICE

(71) Applicants: HEFEI XINSHENG OPTOELECTRONICS TECHNOLOGY CO., LTD., Anhui (CN); BOE TECHNOLOGY GROUP CO., LTD., Beijing (CN)

(72) Inventors: Shi Sun, Beijing (CN); Xuewu Xie, Beijing (CN); Hao Liu, Beijing (CN); Ameng Zhang, Beijing (CN); Yu Ai, Beijing (CN); Bowen Liu, Beijing (CN); Yubao Kong, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/466,499

(22) PCT Filed: Dec. 3, 2018

(86) PCT No.: PCT/CN2018/118854
§ 371 (c)(1),
(2) Date: Jun. 4, 2019

(87) PCT Pub. No.: WO2019/205635
PCT Pub. Date: Oct. 31, 2019

(65) Prior Publication Data
US 2020/0220113 A1 Jul. 9, 2020

(30) Foreign Application Priority Data
Apr. 24, 2018 (CN) .......................... 2018 1 0371300

(51) Int. Cl.
*H01L 27/00* (2006.01)
*H01L 51/00* (2006.01)
(Continued)

(52) U.S. Cl.
CPC .......... *H01L 51/56* (2013.01); *H01L 27/3276* (2013.01); *H01L 51/0021* (2013.01); *H01L 51/5221* (2013.01); *H01L 2227/323* (2013.01)

(58) Field of Classification Search
CPC ............. H01L 27/3276; H01L 27/3246; H01L 27/3244; H01L 27/3279; H01L 27/3248;
(Continued)

(56) References Cited

U.S. PATENT DOCUMENTS 8,318,521 B2 * 11/2012 Bang ................... H01L 51/5228
257/E21.414
8,362,694 B2 * 1/2013 Hanawa .............. H01L 27/3276
313/500
(Continued)

FOREIGN PATENT DOCUMENTS

CN 107611283 A 1/2018
CN 107785381 A 3/2018
(Continued)

OTHER PUBLICATIONS

First Office Action for CN Appl. No. 201810371300.9, dated Mar. 1, 2019.
International Search Report and Written Opinion for International Appl. No. PCT/CN2018/118854, dated Feb. 27, 2019.

*Primary Examiner* — Nikolay K Yushin
(74) *Attorney, Agent, or Firm* — The Webb Law Firm

(57) ABSTRACT

The present disclosure provides a display panel, a manufacturing method of the display panel, and a display device. The manufacturing method includes: forming an auxiliary cathode layer; forming at least one tip structure on the auxiliary cathode layer; forming a main cathode layer, wherein the at
(Continued)

least one tip structure is between the auxiliary cathode layer and the main cathode layer; and forming at least one connection between the main cathode layer and the auxiliary cathode layer by discharging at the at least one tip structure, wherein the at least one connection is electrically connected to the main cathode layer and the auxiliary cathode layer respectively.

19 Claims, 9 Drawing Sheets

(51) Int. Cl.
   *H01L 51/56*    (2006.01)
   *H01L 27/32*    (2006.01)
   *H01L 51/52*    (2006.01)
(58) Field of Classification Search
   CPC .. H01L 51/56; H01L 51/0021; H01L 51/5221
   See application file for complete search history.

(56) References Cited

U.S. PATENT DOCUMENTS

| | | | |
|---|---|---|---|
| 9,741,784 B2* | 8/2017 | Oh | H01L 27/3279 |
| 10,056,036 B2* | 8/2018 | Hong | H01L 27/3276 |
| 2007/0222371 A1* | 9/2007 | Raychaudhuri | H01L 51/5215 |
| | | | 313/504 |
| 2009/0302751 A1* | 12/2009 | Hanawa | H01L 27/3276 |
| | | | 313/504 |
| 2012/0208311 A1* | 8/2012 | Bang | H01L 51/5234 |
| | | | 438/34 |
| 2016/0172425 A1 | 6/2016 | Lee | |
| 2016/0211316 A1* | 7/2016 | Oh | H01L 51/5234 |
| 2017/0330513 A1* | 11/2017 | Hong | H01L 27/3276 |

FOREIGN PATENT DOCUMENTS

| | | |
|---|---|---|
| CN | 108511489 A | 9/2018 |
| CN | 108598291 A | 9/2018 |
| KR | 1020150002422 A | 1/2015 |

* cited by examiner

DISPLAY PANEL AND MANUFACTURING METHOD OF THE DISPLAY PANEL, DISPLAY DEVICE

CROSS-REFERENCE TO RELATED APPLICATIONS

The present disclosure is a U.S. National Stage Application under 35 U.S.C. § 371 of International Patent Application No. PCT/CN2018/118854, filed on Dec. 3, 2018, which claims priority to China Patent Application No. 201810371300.9, filed on Apr. 24, 2018, the disclosure of both of which are incorporated by reference herein in entirety.

TECHNICAL FIELD

The present disclosure relates to a display panel, a manufacturing method of the display panel, and a display device.

BACKGROUND

For OLED (Organic Light Emitting Diode) devices, light can be emitted from one side of the cathode layer. Therefore, the cathode layer needs to have a better transmittance. In addition, OLED devices also need to have a lower square resistance.

SUMMARY

According to one aspect of embodiments of the present disclosure, there is provided a manufacturing method of a display panel. The manufacturing method comprises: forming an auxiliary cathode layer; forming at least one tip structure on the auxiliary cathode layer; forming a main cathode layer, wherein the at least one tip structure is between the auxiliary cathode layer and the main cathode layer; and forming at least one connection between the main cathode layer and the auxiliary cathode layer by discharging at the at least one tip structure, wherein the at least one connection is electrically connected to the main cathode layer and the auxiliary cathode layer respectively.

In some embodiments, the process of discharging at the at least one tip structure comprises: applying a first voltage to the main cathode layer and applying a second voltage to the auxiliary cathode layer, a polarity of the first voltage being opposite to a polarity of the second voltage, or generating static electricity on the auxiliary cathode layer by using an electrostatic generation device, to discharge at the at least one tip structure.

In some embodiments, the at least one tip structure comprises at least one bump.

In some embodiments, the manufacturing method further comprises: forming a driving transistor comprising a gate, a source, and a drain before forming the main cathode layer, wherein the auxiliary cathode layer is formed in a process of forming at least one of the gate, the source, or the drain, and a material of the auxiliary cathode layer comprises at least one of materials of the gate, the source, or the drain; wherein, the step of forming the at least one tip structure comprises: forming the at least one bump by etching the auxiliary cathode layer.

In some embodiments, the manufacturing method further comprises: forming an anode layer before forming the main cathode layer, the auxiliary cathode layer being formed in the process of forming the anode layer, and a material of the auxiliary cathode layer comprising a material of the anode layer; wherein, the step of forming the at least one tip structure comprises: etching the auxiliary cathode layer with an adjustable etching rate to form the at least one bump.

In some embodiments, the manufacturing method further comprises: forming a pixel definition layer after forming the auxiliary cathode layer, a portion of which is formed on the auxiliary cathode layer; wherein, the step of forming the at least one tip structure comprises: etching the portion of the pixel definition layer on the auxiliary cathode layer to form the at least one bump.

In some embodiments, the step of forming the at least one tip structure comprises: forming a photoresist on the auxiliary cathode layer; and performing photolithography on the photoresist to form the at least one bump.

In some embodiments, the step of forming the at least one tip structure comprises: etching a side of the auxiliary cathode layer such that the side of the auxiliary cathode layer is recessed to form the at least one tip structure.

In some embodiments, the auxiliary cathode layer is formed on a backplane glass before forming the main cathode layer; and before forming the main cathode layer, the manufacturing method further comprises: forming an organic layer, a portion of the organic layer being located between the main cathode layer and the auxiliary cathode layer after the main cathode layer is formed; wherein, the first voltage is a positive voltage, the second voltage is a negative voltage.

In some embodiments, at least one of the first voltage or the second voltage is a voltage whose magnitude varies with time.

According to another aspect of an embodiment of the present disclosure, there is provided a display panel. The display panel comprises: a main cathode layer; an auxiliary cathode layer; at least one tip structure on a surface of the auxiliary cathode layer close to the main cathode layer; and at least one connection between the main cathode layer and the auxiliary cathode layer, electrically connected to the main cathode layer and the auxiliary cathode layer respectively, wherein the at least one connection covers the at least one tip structure.

In some embodiments, the at least one tip structure comprises at least one bump.

In some embodiments, the at least one tip structure comprises a corner of the auxiliary cathode layer.

In some embodiments, a material of the at least one tip structure comprises a conductive material or an insulating material.

In some embodiments, the display panel further comprises an anode layer and a driving transistor; wherein, a material of the at least one tip structure comprises at least one of a material of the anode layer or a material of an electrode of the driving transistor.

In some embodiments, the display panel further comprises a pixel definition layer, wherein a material of the at least one tip structure comprises a material of the pixel definition layer.

In some embodiments, the at least one connection is a part of a melted cathode layer.

In some embodiments, the display panel further comprises: a main cathode pad electrode connected to the main cathode layer; and an auxiliary cathode pad electrode connected to the auxiliary cathode layer.

In some embodiments, the display panel further comprises: a backplane glass and a cover glass disposed opposite to the backplane glass, wherein the main cathode layer and the auxiliary cathode layer are between the backplane glass and the cover glass, wherein the auxiliary cathode layer is between the main cathode layer and the backplane glass, or the auxiliary cathode layer is between the main cathode layer and the cover glass.

According to another aspect of an embodiment of the present disclosure, there is provided a display device. The display device comprises the display panel as described above.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure, in which.

Figure 1:
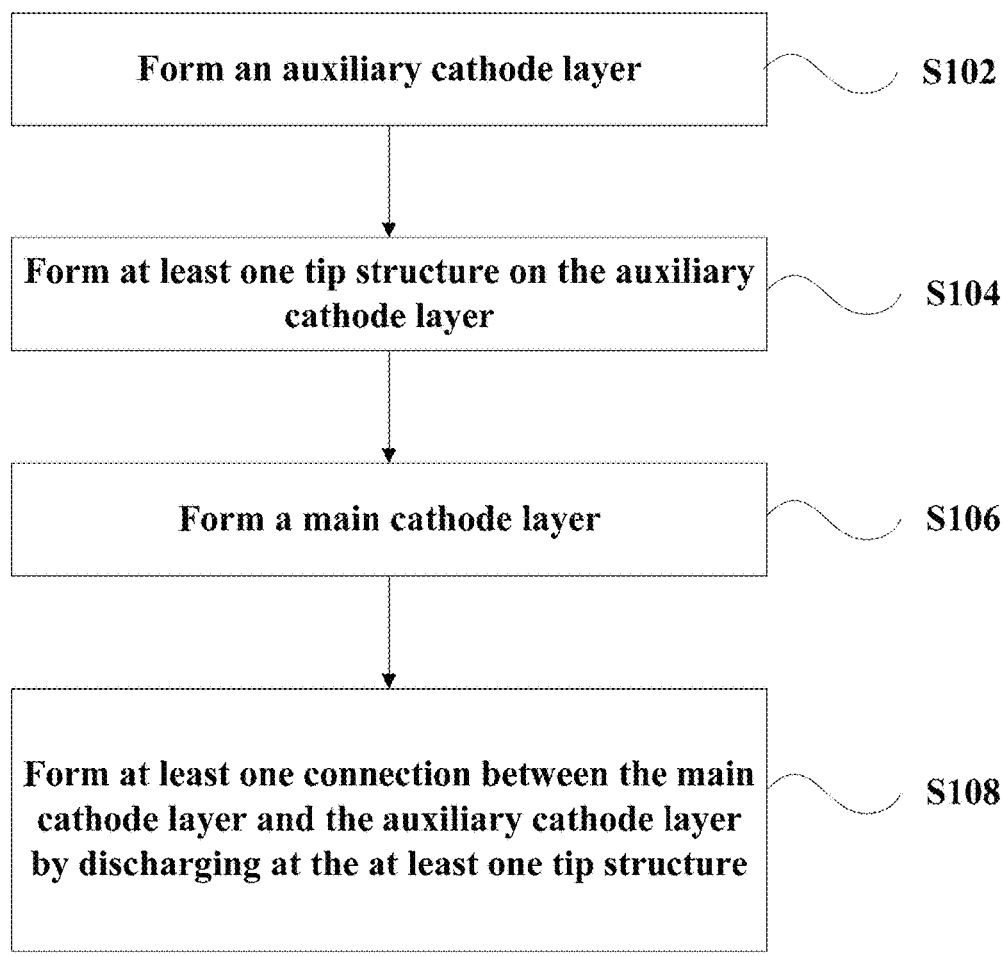
FIG. 1 shows a flow chart of a manufacturing method of a display panel according to an embodiment of the present disclosure.

It should be understood that the dimensions of the various parts shown in the drawings are not drawn to the actual scale. In addition, the same or similar reference signs are used to denote the same or similar components.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or variants thereof means that the element before the word covers the element(s) listed after the word without excluding the possibility of also covering other elements. The terms "up", "down", "left", "right" or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

Unless otherwise defined, all terms (comprising technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, in order to guarantee a preferable transmittance of the cathode layer, it is necessary to make the cathode layer very thin. However, this causes an increase in the square resistance, so that the driving voltage is increased and the voltage stability is lowered. In the related art, the square resistance can be lowered by adding an auxiliary cathode to the device.

One method in the related art for forming the auxiliary cathode is to form the auxiliary cathode on a backplane glass. Since in the large-sized OLEDs, relevant organic layers (for example, the organic layers may comprise an electron injection layer, an electron transport layer, a light emitting layer, a hole transport layer, a hole injection layer, etc.) are evaporated on an entire surface, the organic layers may be present between the cathode layer and the auxiliary cathode, such that the cathode layer cannot be electrically connected to the auxiliary cathode.

In the related art, a laser device may be used to melt the cathode metal to electrically connect the cathode layer to the auxiliary cathode. However, the inventors of the present disclosure have found that this method has the following disadvantages: (1) the addition of a new laser process requires the purchase of a laser device, and thus the cost is high; (2) a 4K television having a resolution of 3840×2160 needs nearly 10 million times of laser irradiation if one laser irradiation is required for each pixel, and thus the production efficiency is low; (3) since the cathode layer is very thin, experimental tests show that the laser irradiation effect is not good enough, and it is difficult to electrically connect the cathode layer to the auxiliary cathode, or the resistance between the cathode layer and the auxiliary cathode is large after the cathode layer being electrically connected to the auxiliary cathode, resulting in an undesirable electrical connection effect.

Another method for forming the auxiliary cathode in the related art is to form the auxiliary cathode on a cover glass. After the cathode layer is formed by the evaporation process, a backplane glass is butt jointed to the cover glass by a encapsulation process. When the backplane glass is butt jointed to the cover glass, the auxiliary cathode is electrically connected to the cathode layer by a TCF (transparent conductive film) conductive material. However, the inventors of the present disclosure have found that the process of this method is complicated, and in the butt jointing process, the TCF is easily crushed and destroyed, so that the effect of contacting the TCF to the cathode layer is not good, and the yield is low.

Therefore, the production efficiency or yield of the method of electrically connecting the cathode layer to the auxiliary cathode in the related art is relatively low. In view of this, some embodiments of the present disclosure provide a manufacturing method of a display panel. The manufacturing method of the display panel according to some embodiments of the present disclosure will be described in detail below with reference to the accompanying drawings.

FIG. 1 shows a flow chart of a manufacturing method of a display panel according to an embodiment of the present disclosure. The manufacturing method may comprise steps S102 to S108.

At step S102, an auxiliary cathode layer is formed. For example, the auxiliary cathode layer may be formed on a backplane glass. As another example, the auxiliary cathode layer may be formed above a cover glass.

At step S104, at least one tip structure is formed on the auxiliary cathode layer. For example, the at least one tip structure may comprise at least one bump. For example, each of the at least one tip structure may comprise the bump. As another example, the tip structure may comprise a corner of the auxiliary cathode layer. The corner is formed by a side surface and a top surface of the auxiliary cathode layer.

At step S106, a main cathode layer is formed. After forming the main cathode layer, the at least one tip structure is between the auxiliary cathode layer and the main cathode layer.

In some embodiments, the auxiliary cathode layer may be formed on or above the backplane glass. Before step S106, the manufacturing method may further comprise forming an organic layer. For example, the organic layer may comprise a carrier functional layer and a light emitting layer. For example, the carrier functional layer may comprise at least one of an electron injection layer, an electron transport layer, a hole transport layer, or a hole injection layer. A portion of the organic layer is located between the main cathode layer and the auxiliary cathode layer after the main cathode layer is formed.

At step S108, at least one connection is formed between the main cathode layer and the auxiliary cathode layer by discharging at the at least one tip structure. The at least one connection is electrically connected to the main cathode layer and the auxiliary cathode layer respectively.

In some embodiments, the process of discharging at the at least one tip structure comprises: applying a first voltage to the main cathode layer and applying a second voltage to the auxiliary cathode layer, a polarity of the first voltage being opposite to a polarity of the second voltage.

For example, in the case where the auxiliary cathode layer is formed on the backplane glass, the portion of the organic layer is located between the main cathode layer and the auxiliary cathode layer. For example, the organic layer may comprise an electron injection layer, an electron transport layer, a light emitting layer, a hole transport layer, a hole injection layer, and the like. For example, the electron injecting layer is in contact with the main cathode layer, and the hole injection layer is in contact with the auxiliary cathode layer. When a positive voltage is applied to the hole injection layer and a negative voltage is applied to the electron injection layer, holes and electrons recombine in the light emitting layer to emit light. Holes and electrons cannot be transported if the voltages are reversed and thus light cannot be emitted, and the resistance between the hole injection layer and the electron injection layer is also very large (for example, it may be regarded as infinity). Therefore, the organic layer here has a characteristic of being conductive to emit light when it is positively energized and having a very large resistance when it is negatively energized.

In some embodiments, the first voltage is a positive voltage, the second voltage is a negative voltage. That is, negative voltage may be applied to the auxiliary cathode layer and a positive voltage may be applied to the main cathode layer. This may cause a tip discharge at the tip structure to break down the organic layer between the main cathode layer and the auxiliary cathode layer, so that a via hole is generated in the organic layer at the location of the tip structure. Also, during the tip discharge, for example, a portion of the main cathode layer at the tip structure is melted so as to flow through the via hole and form a connection. The connection electrically connects the main cathode layer to the auxiliary cathode layer.

For another example, in the case where the auxiliary cathode layer is formed above the cover glass, after the backplane glass is butt jointed to the cover glass, a filling layer is formed between the main cathode layer and the auxiliary cathode layer. The first voltage is applied to the main cathode layer and the second voltage is applied to the auxiliary cathode layer to break down the filling layer and form the at least one connection. The at least one connection electrically connects the main cathode layer to the auxiliary cathode layer.

It should be noted that the negative voltage described herein may comprise a negative polarity voltage. In other embodiments, the negative voltage may comprise a voltage of 0V.

In other embodiments, static electricity may be generated on the auxiliary cathode layer by using an electrostatic generation device to discharge at the at least one tip structure. In this embodiment, a static electricity generation device may be used to generate static electricity on the auxiliary cathode layer, and the organic layer at the tip structure (for example, the bump) is broken down by electrostatic electricity to electrically connect the main cathode layer to the auxiliary cathode layer.

In the manufacturing method of the above embodiment, the at least one tip structure is formed on the auxiliary cathode layer, and the at least one connection is formed between the main cathode layer and the auxiliary cathode layer by discharging at the at least one tip structure, thereby electrically connecting the main cathode layer to the auxiliary cathode layer. The process of this method is relatively simple and may improve the production efficiency and yield.

In addition, the above manufacturing method may implement electrical conduction between the main cathode layer and the auxiliary cathode layer easily, and the electrical conduction effect is relatively good. Furthermore, the above manufacturing method does not need a laser device, and therefore the cost is relatively low.

In some embodiments, the step of applying the first voltage to the main cathode layer and applying the second voltage to the auxiliary cathode layer may be performed on a lighting machine or an aging machine without adding other new equipment, which may reduce the production cost.

In some embodiments, the first voltage is applied to the main cathode layer and the second voltage is applied to the auxiliary cathode layer in the form of direct current voltages. For example, the voltage applied to the auxiliary cathode layer may be a voltage of 0 V (as a special negative voltage), and the voltage applied to the main cathode layer may be a voltage of 10 V to 50 V. Experiments have shown that the greater the voltage applied to the main cathode layer, the better the conduction effect. In the case where the voltage applied to the main cathode layer exceeds 50 V, the electrical conduction effect may be further improved.

In some embodiments, at least one of the first voltage or the second voltage is a voltage whose magnitude varies with time. For example, the voltage applied to the auxiliary cathode layer may be 0V, and the voltage applied to the main cathode layer may be a voltage having a magnitude varying between 0 and 50V with time, and its change frequency may be 60 Hz. Such a voltage application method makes the electric field change frequently, as a result, it may discharge at the tip structure frequently, and a better electrical conduction effect may be achieved.

Of course, those skilled in the art should understand that the voltage application method of embodiments of the present disclosure is not limited to the manner described above, and the embodiments of the present disclosure may also adopt other voltage application methods as long as the main cathode layer and the auxiliary cathode layer may be electrically connected to each other.

In some embodiments, the time for applying voltages to the main cathode layer and the auxiliary cathode layer ranges from 1 second to 5 seconds, such as 3 seconds. Since the tip discharge is instantaneous and the time when the voltage is applied is only a few seconds, the time cost is relatively low.

FIGS. 2A through 2D are cross-sectional views illustrating structures of some stages in a manufacturing process of a display panel according to some embodiments of the present disclosure. FIG. 2E is a top view of the structure shown in FIG. 2C or 2D. The manufacturing method of the display panel according to some embodiments of the present disclosure will be described in detail below with reference to FIGS. 2A through 2E.

Figure 2A:
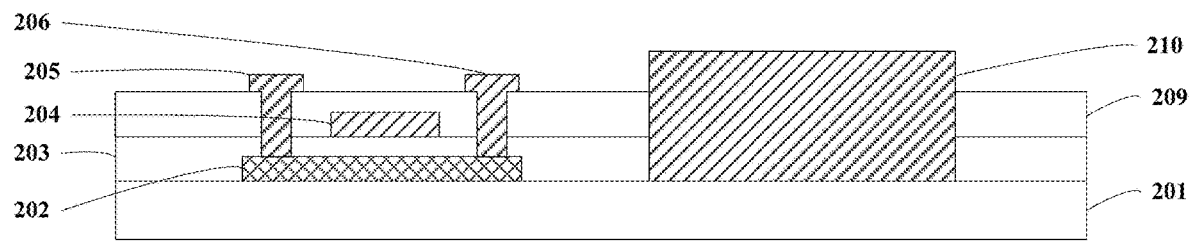
FIGS. 2A through 2D are cross-sectional views illustrating structures of some stages in a manufacturing process of a display panel according to some embodiments of the present disclosure.

First, as shown in FIG. 2A, a driving transistor is formed. The driving transistor may comprise a gate 204, a source 205, and a drain 206. The driving transistor may further comprise a semiconductor layer 202 and a gate insulating layer 203. The source 205 and the drain 206 are connected to the semiconductor layer 202, respectively. The gate insulating layer 203 spaces the gate 204 apart from the semiconductor layer 202. The driving transistor is formed on a backplane glass 201. Further, as shown in FIG. 2A, an interlayer insulating layer 209 may be further formed in the manufacturing method. The interlayer insulating layer 209 covers the gate 204 and causes the gate 204 to be spaced apart from the source 205 and the drain 206, respectively.

In other embodiments, a capacitor, another insulating layer, and a planarizing layer (not shown in the figure) and the like may also be formed on the backplane glass, which will not be described in detail herein.

In some embodiments, as shown in FIG. 2A, an auxiliary cathode layer 210 is formed in a process of forming at least one of the gate 204, the source 205, or the drain 206. For example, the auxiliary cathode layer 210 may be formed on the backplane glass 201. As another example, the auxiliary cathode layer 210 may be formed above the backplane glass 201. For example, a portion of the gate insulating layer 203 may be formed on the backplane glass 201, and the auxiliary cathode layer may be formed on the portion of the gate insulating layer 203, so that the auxiliary cathode layer 210 is formed above the backplane glass 201. The auxiliary cathode layer 210 and the driving transistor are located on the same side of the backplane glass 201. A material of the auxiliary cathode layer 210 may comprise at least one of materials of the gate 204, the source 205, or the drain 206. For example, the gate 204, the source 205, or the drain 206 may respectively comprise a three-layer structure such as a Mo (molybdenum) layer/an Al (aluminum) layer/a Mo (molybdenum) layer. Therefore, the auxiliary cathode layer 210 may also comprise the Mo layer/the Al layer/the Mo layer.

In some embodiments, as shown in FIG. 2E, an auxiliary cathode pad electrode 213 connected to the auxiliary cathode layer 210 may also be formed during the formation of the auxiliary cathode layer 210.

Figure 2B:
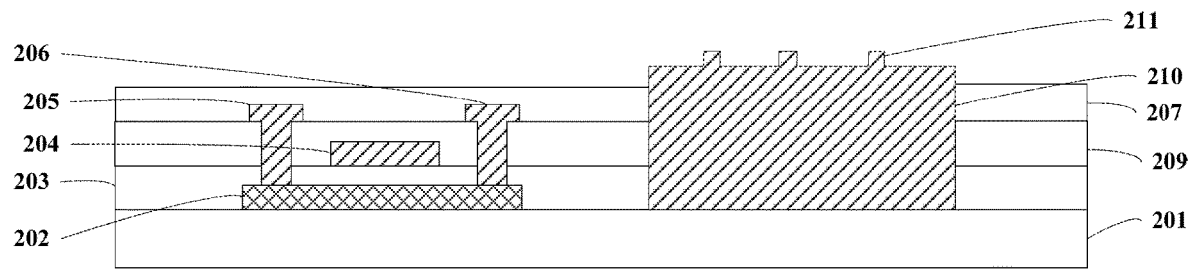

Next, as shown in FIG. 2B, at least one tip structure 211 is formed on the auxiliary cathode layer 210. The tip structure 211 may be a bump. The bump has an irregular shape, so that the upper surface of the auxiliary cathode layer is rough and uneven. For example, at least one bump may be formed by etching the auxiliary cathode layer. For example, in the case where the uppermost layer of the auxiliary cathode layer is a Mo layer, an etching operation may be performed on the Mo layer by an incomplete exposure process, so that the at least one bump with a columnar shape (for example, a cylindrical or trapezoidal columnar shape) is formed on the surface of the Mo layer.

Here, the incomplete exposure process means that a portion of the auxiliary cathode layer in, for example, a three-layer structure (Mo/Al/Mo film layers) is exposed while another portion thereof is not exposed in a photolithography and etching operation. Wherein, the unexposed portion is a structure of Mo/Al/Mo film layers, and the uppermost Mo layer portion is etched away from the exposed portion to remain the Al/Mo film layers. Thus, a portion of the remaining uppermost Mo layer is formed on the auxiliary cathode layer as the at least one bump.

It should be noted that the shape of the bump is not limited to the above-mentioned columnar shape, and may be other shapes which may be used as a tip structure, for example, a cube, a cone, an ellipsoid or other irregular shape. Accordingly, the scope of embodiments of the present disclosure is not limited to the shape of the bump described herein. In addition, one or more bumps are present on each sub-pixel of the display panel. The more bumps on each sub-pixel, the better the effect of the tip discharge.

In some embodiments, as shown in FIG. 2B, a passivation layer 207 may be formed before the at least one tip structure 211 is formed. Alternatively, the passivation layer 207 may be formed after the at least one tip structure 211 is formed.

Figure 2C:
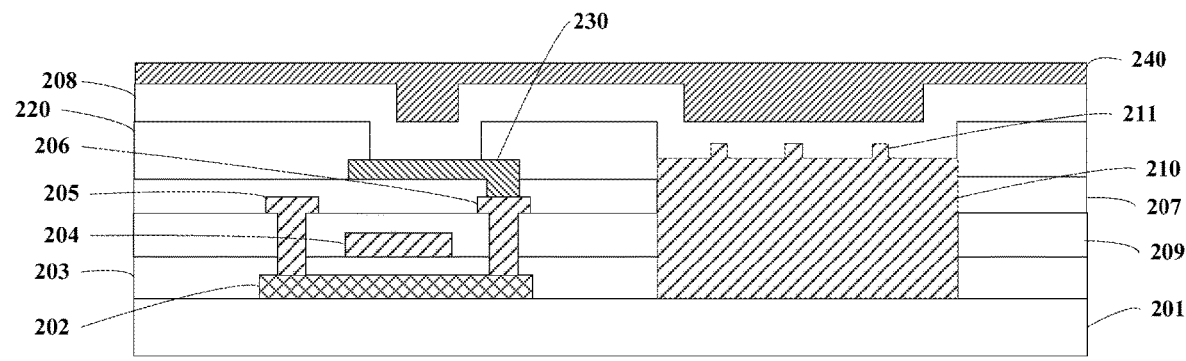

Next, as shown in FIG. 2C, an anode layer 230 is formed. For example, the anode layer 230 may be connected to the drain 206. Alternatively, the anode layer may be connected to the source (not shown). Then, a pixel definition layer 220 is formed. The pixel definition layer may define a light emitting area. The pixel definition layer 220 exposes the anode layer 230 and the auxiliary cathode layer 210.

Next, as shown in FIG. 2C, the organic layer 208 is formed, for example, by evaporation on the entire surface. The organic layer 208 covers the anode layer 230 and the auxiliary cathode layer 210. For example, the organic layer 208 may comprise an electron injection layer, an electron transport layer, a light emitting layer, a hole transport layer, a hole injection layer, and the like. For example, the organic layer 208 may have a thickness of about 0.3 microns.

Then, as shown in FIG. 2C, a main cathode layer 240 is formed on a side of the organic layer 208 facing away from the auxiliary cathode layer. Thus, a portion of the organic layer 208 is located between the main cathode layer 240 and the auxiliary cathode layer 210. In addition, the at least one tip structure 211 is also located between the main cathode layer 240 and the auxiliary cathode layer 210. The main cathode layer may be a co-evaporated layer of Mg and Ag. The main cathode layer is relatively thin, so that light emitted from the light emitting layer in the organic layer may be transmitted from the main cathode layer.

In some embodiments, as shown in FIG. 2E, a main cathode pad electrode 243 connected to the main cathode layer 240 may also be formed during the formation of the main cathode layer 240.

Figure 2D:
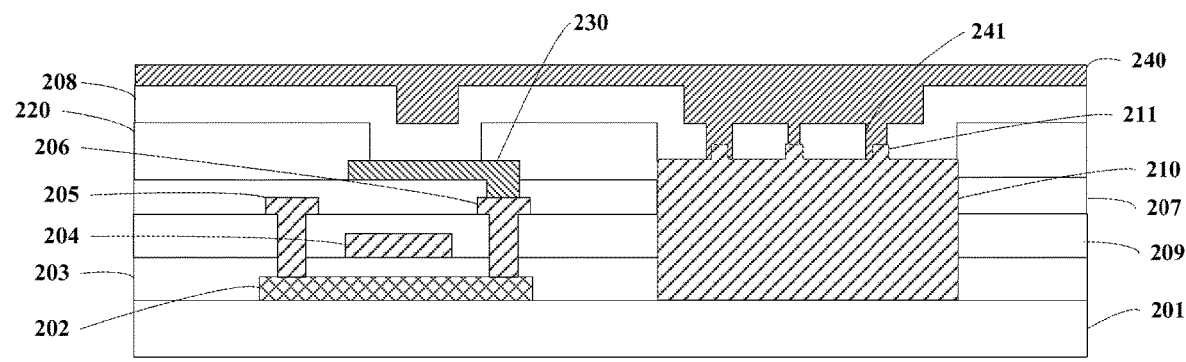
Figure 2E:
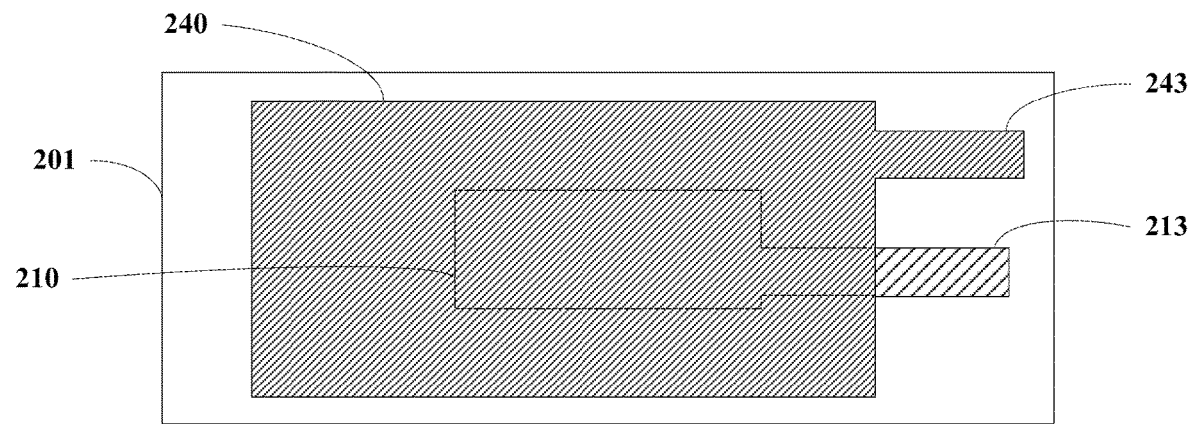
FIG. 2E is a top view of the structure shown in FIG. 2C or 2D.

Next, as shown in FIG. 2D, for example, a negative voltage (for example, the negative voltage may comprise a voltage of 0 V) may be applied to the auxiliary cathode pad electrode 213 and a positive voltage is applied to the main cathode pad electrode 243, so that the negative voltage is applied to the auxiliary cathode layer 210 and the positive voltage is applied to the main cathode layer 240. At the moment when the voltages are applied, a change in electric field causes tip discharge at the at least one bump. The organic layer 208 is broken down by the discharge at the at least one tip structure 211. During the tip discharge, the main cathode layer 240 is melted at the at least one tip structure to form at least one connection 241 between the main cathode layer 240 and the auxiliary cathode layer 210, so that the main cathode layer 240 is electrically connected to the auxiliary cathode layer 210.

Heretofore, a manufacturing method of a display panel according to some embodiments of the present disclosure has been provided. In the manufacturing method, an auxiliary cathode layer is formed in a process of forming at least one of a gate, a source or a drain of a driving transistor. Photolithography and etching operations are performed on the auxiliary cathode layer such that at least one bump is formed on the surface of the auxiliary cathode layer. The at least one bump serves as at least one tip structure. At least one connection is formed between the main cathode layer and the auxiliary cathode layer by discharging at the at least one tip structure, such that the main cathode layer is electrically connected to the auxiliary cathode layer. The process of this method is relatively simple and may improve the production efficiency and yield.

A display panel according to some embodiments of the present disclosure is formed by the above manufacturing method. For example, as shown in FIG. 2D, the display panel comprises a main cathode layer 240 and an auxiliary cathode layer 210. The display panel may further comprise at least one tip structure 211 on a surface of the auxiliary cathode layer 210 close to the main cathode layer 240. The display panel may further comprise at least one connection 241. The at least one connection 241 is between the main cathode layer 240 and the auxiliary cathode layer 210. The at least one connection 241 is electrically connected to the main cathode layer 240 and the auxiliary cathode layer 210, respectively. The at least one connection 241 covers the at least one tip structure 211. For example, the connection 241 may be directly connected to the auxiliary cathode layer 210. As another example, the connection 241 may be connected to the auxiliary cathode layer 210 through the tip structure 211. In some embodiments, the at least one connection is a part of a melted cathode layer. For example, the melted cathode layer may comprise a melted main cathode layer or a melted auxiliary cathode layer. In the display panel of this embodiment, the main cathode layer is electrically connected to the auxiliary cathode layer by the at least one connection, which may reduce the square resistance of the main cathode layer.

In some embodiments, the display panel may further comprise a backplane glass 201 and a cover glass (not shown in FIG. 2D) disposed opposite to the backplane glass 201. The main cathode layer 240 and the auxiliary cathode layer 210 are between the backplane glass and the cover glass. The auxiliary cathode layer 210 is between the main cathode layer 240 and the backplane glass 201.

In some embodiments, as shown in FIG. 2D, the at least one tip structure 241 may comprise at least one bump. For example, each of the at least one bump may range in diameter from 0.3 microns to 5 microns. For example, the bump may have a diameter of 0.5 microns, 1 micron, 2 microns, or 4 microns, and the like. The bump in this diameter range has a better discharge effect, with which the organic layer or the like is easy to be broken down.

In some embodiments, a material of the at least one tip structure 211 may comprise a conductive material, such as a metal material.

In some embodiments, as shown in FIG. 2D, the display panel may further comprise an anode layer 230 and a driving transistor. The driving transistor may comprise a gate 204, a source 205, and a drain 206. The driving transistor may further comprise a semiconductor layer 202 and a gate insulating layer 203. The source 205 and the drain 206 are connected to the semiconductor layer 202, respectively. The gate insulating layer 203 spaces the gate 204 apart from the semiconductor layer 202. The driving transistor is formed on a backplane glass 201.

In some embodiments, the material of the at least one tip structure 211 may comprise a material of an electrode (e.g., the gate 204, the source 205, or the drain 206) of the driving transistor.

In some embodiments, as shown in FIG. 2D, the display panel may further comprise an organic layer 208. A portion of the organic layer 208 is located between the anode layer 230 and the main cathode layer 240. Another portion of the organic layer 208 is located between the main cathode layer 240 and the auxiliary cathode layer 210. The at least one connection 241 passes through the portion of the organic layer between the main cathode layer 240 and the auxiliary cathode layer 210, such that the main cathode layer 240 is electrically connected to the auxiliary cathode layer 210.

In some embodiments, as shown in FIG. 2D, the display panel may further comprise a passivation layer 207 and an interlayer insulating layer 209. The passivation layer 207 covers the source 205 and the drain 206. The interlayer insulating layer 209 covers the gate 204 and spaces the gate 204 apart from the source 205 and the drain 206, respectively.

In some embodiments, as shown in FIG. 2D, the display panel may further comprise a pixel definition layer 220. The pixel definition layer 220 may expose the anode layer 230 and the auxiliary cathode layer 210.

In some embodiments, as shown in FIG. 2E, the display panel may further comprise a main cathode pad electrode 243. The main cathode pad electrode 243 is connected to the main cathode layer 240. The display panel may further comprise an auxiliary cathode pad electrode 213. The auxiliary cathode pad electrode 213 is connected to the auxiliary cathode layer 210.

FIGS. 3A through 3D are cross-sectional views illustrating structures of some stages in a manufacturing process of a display panel according to other embodiments of the present disclosure. The manufacturing process of the display panel according to other embodiments of the present disclosure will be described in detail below with reference to FIGS. 3A through 3D.

Figure 3A:
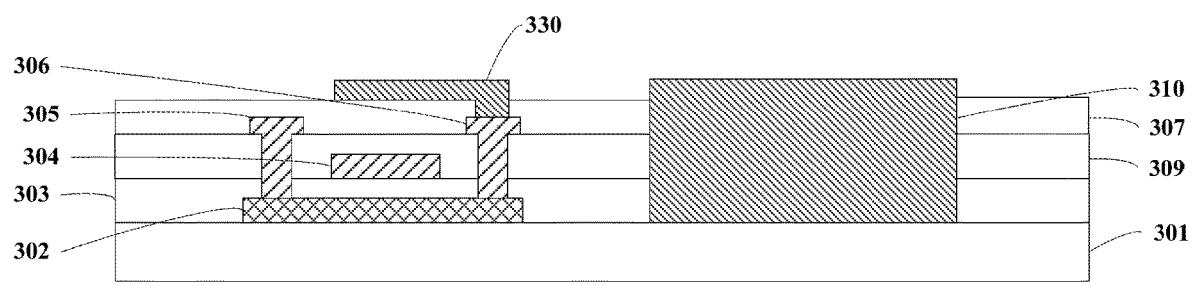
FIGS. 3A through 3D are cross-sectional views illustrating structures of some stages in a manufacturing process of a display panel according to other embodiments of the present disclosure.

First, as shown in FIG. 3A, a driving transistor is formed on a backplane glass 301. The driving transistor may comprise a semiconductor layer 302, a gate insulating layer 303, a gate 304, a source 305, and a drain 306. In addition, an interlayer insulating layer 309 and a passivation layer 307 may also be formed. Then, an anode layer 330 is formed.

In some embodiments, as shown in FIG. 3A, an auxiliary cathode layer 310 is formed in the process of forming the anode layer 330. For example, the auxiliary cathode layer 310 may be formed on the backplane glass 301. As another example, the auxiliary cathode layer 310 may be formed above the backplane glass 301. The auxiliary cathode layer 310 and the driving transistor are located on the same side of the backplane glass. A material of the auxiliary cathode layer 310 comprises a material of the anode layer 330. For example, the anode layer may comprise a three-layer structure such as an ITO (Indium Tin Oxide) layer/an Ag (silver) layer/an ITO layer. Accordingly, the auxiliary cathode layer 310 may also comprise a three-layer structure such as the ITO layer/the Ag layer/the ITO layer.

Figure 3B:
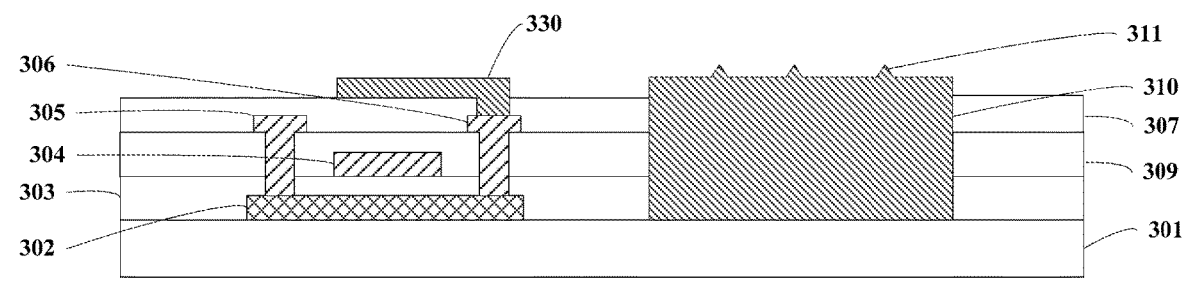

Next, as shown in FIG. 3B, at least one tip structure 311 is formed on the auxiliary cathode layer 310. The at least one tip structure 311 may comprise at least one bump. In some embodiments, the auxiliary cathode layer 310 is etched with an adjustable etching rate to form the at least one bump. For example, in the case where the uppermost layer of the auxiliary cathode layer is an ITO layer, the upper surface of the ITO layer may be roughened by intermittently adjusting the rate at which the ITO is etched, thereby forming the at least one bump.

Figure 3C:
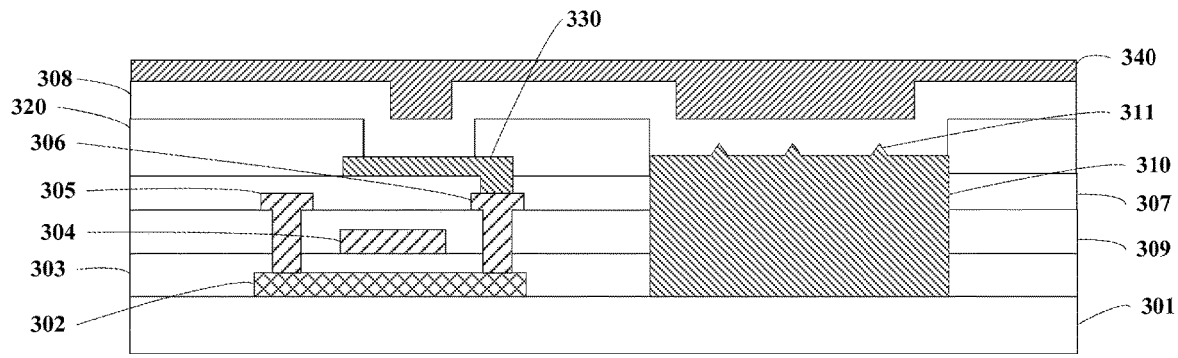

Next, as shown in FIG. 3C, a pixel definition layer 320 is formed on the structure shown in FIG. 3B. The pixel definition layer 320 exposes the anode layer 330 and the auxiliary cathode layer 310. Next, as shown in FIG. 3C, an organic layer 308 is formed. The organic layer 308 covers the anode layer 330 and the auxiliary cathode layer 310. For example, the organic layer 308 may comprise an electron injection layer, an electron transport layer, a light emitting layer, a hole transport layer, a hole injection layer, and the like. Then, a main cathode layer 340 is formed on a side of the organic layer 308 facing away from the auxiliary cathode layer. Thus, a portion of the organic layer 308 is located between the main cathode layer 340 and the auxiliary cathode layer 310. In addition, the at least one tip structure 311 is also located between the main cathode layer 340 and the auxiliary cathode layer 310.

Figure 3D:
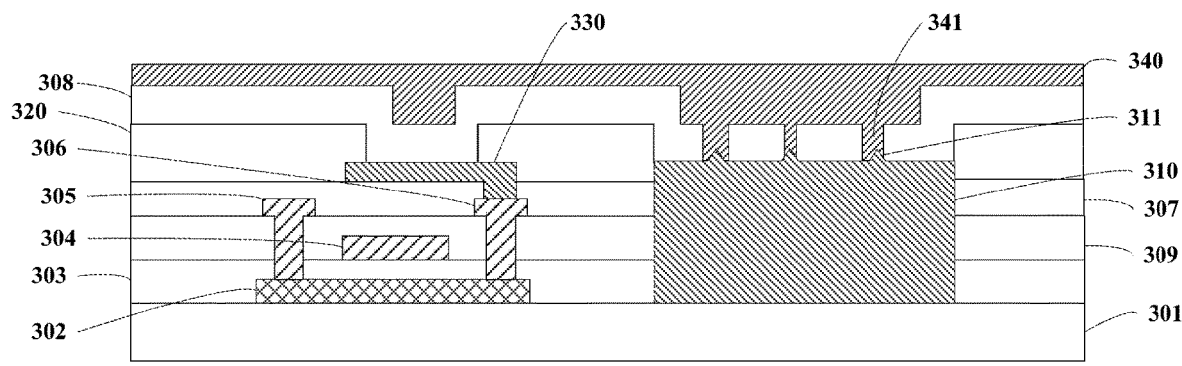

Next, as shown in FIG. 3D, a negative voltage (for example, the negative voltage may comprise a voltage of 0 V) is applied to the auxiliary cathode layer 310 and a positive voltage is applied to the main cathode layer 340. The organic layer 308 is broken down by discharging at the at least one tip structure 311. During the tip discharge, the main cathode layer 340 is melted at the at least one tip structure to form at least one connection 341 between the main cathode layer 340 and the auxiliary cathode layer 310, so that the main cathode layer 340 is electrically connected to the auxiliary cathode layer 310.

Heretofore, a manufacturing method of a display panel according to other embodiments of the present disclosure has been provided. In this manufacturing method, an auxiliary cathode layer is formed in a process of forming an anode layer. The auxiliary cathode layer is etched with an adjustable etching rate to form at least one bump. The at least one bump serves as at least one tip structure. At least one connection is formed between the main cathode layer and the auxiliary cathode layer by discharging at the at least one tip structure, such that the main cathode layer is electrically connected to the auxiliary cathode layer. The process of this method is relatively simple and may improve the production efficiency and yield. Moreover, the at least one bump may be formed by adjusting the etching rate without the need to add new equipment.

According to the above manufacturing method, a display panel according to other embodiments of the present disclosure is formed, as shown in FIG. 3D. The display panel shown in FIG. 3D differs from the display panel shown in FIG. 2D in that a material of the at least one tip structure 311 may comprise a material of the anode layer 330.

In some embodiments of the present disclosure, the material of the at least one tip structure may comprise at least one of the material of the anode layer and the material of the electrode (e.g., the gate, the source, or the drain) of the driving transistor.

FIGS. 4A through 4D are cross-sectional views illustrating structures of some stages in a manufacturing process of a display panel according to further embodiments of the present disclosure. The manufacturing process of the display panel according to further embodiments of the present disclosure will be described in detail below with reference to FIGS. 4A through 4D.

Figure 4A:
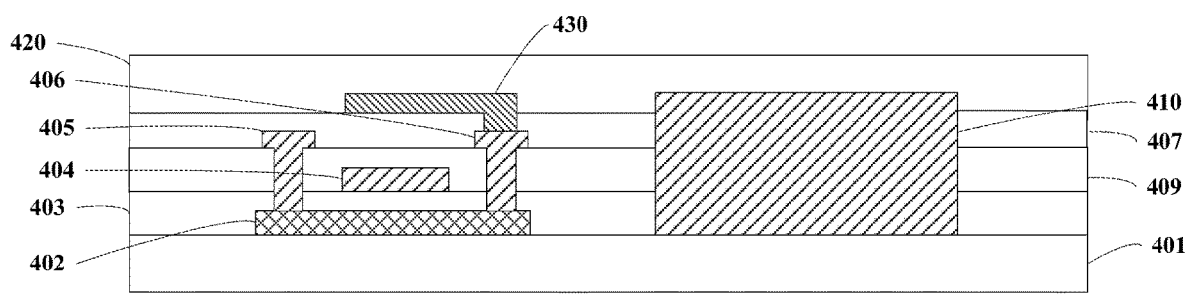
FIGS. 4A through 4D are cross-sectional views illustrating structures of some stages in a manufacturing process of a display panel according to further embodiments of the present disclosure.

First, as shown in FIG. 4A, a driving transistor is formed on a backplane glass 401. The driving transistor may comprise a semiconductor layer 402, a gate insulating layer 403, a gate 404, a source 405, and a drain 406. In addition, an interlayer insulating layer 409 and a passivation layer 407 may also be formed. Then, an anode layer 430 is formed.

In some embodiments, as shown in FIG. 4A, an auxiliary cathode layer 410 may be formed in a process of forming at least one of the gate 404, the source 405, or the drain 406. In other embodiments, the auxiliary cathode layer 410 may be formed in a process of forming the anode layer 430. The formation process of the auxiliary cathode layer 410 is similar to that described above and will not be described herein. For example, the auxiliary cathode layer 410 may be formed on the backplane glass 401. As another example, the auxiliary cathode layer 410 may be formed above the backplane glass 401.

Next, as shown in FIG. 4A, after the auxiliary cathode 410 is formed, a pixel definition layer 420 is formed. A portion of the pixel definition layer 420 is formed on the auxiliary cathode layer 410.

Figure 4B:
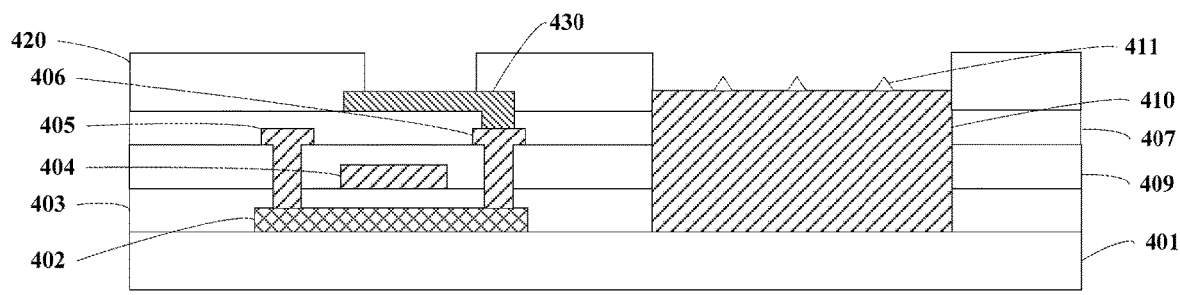

Next, as shown in FIG. 4B, the pixel definition layer 420 is etched to expose a side of the anode layer 430 facing away from the driving transistor. During the etching process, the portion of the pixel definition layer 420 on the auxiliary cathode layer 410 may also be etched to form at least one bump. The at least one bump is the at least one tip structure 411. For example, during the process of etching the pixel definition layer, the upper surface of the auxiliary cathode layer is also exposed, and (for example, by incomplete exposure process) the portion of the pixel definition layer on the upper surface of the auxiliary cathode layer is etched incompletely to remaining the at least one bump.

Figure 4C:
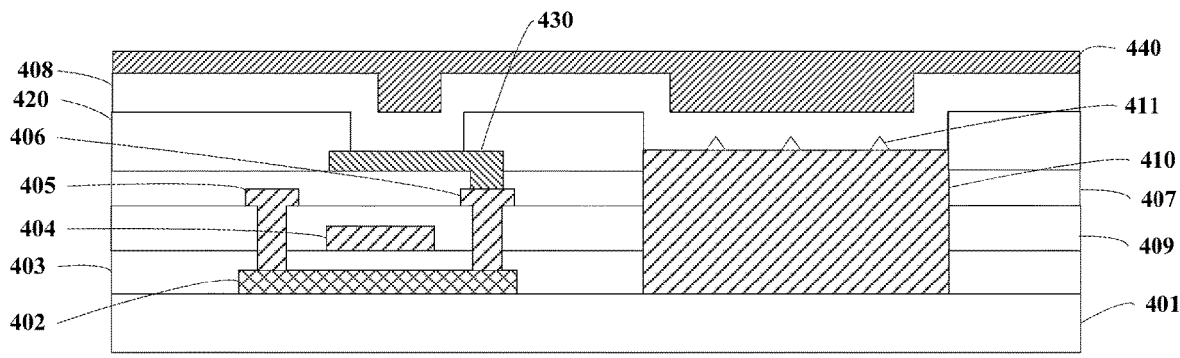

Next, as shown in FIG. 4C, an organic layer 408 is formed. The organic layer 408 covers the anode layer 430 and the auxiliary cathode layer 410. For example, the organic layer 408 may comprise an electron injection layer, an electron transport layer, a light emitting layer, a hole transport layer, a hole injection layer, and the like. Then, a main cathode layer 440 is formed on a side of the organic layer 408 facing away from the auxiliary cathode layer. Thus, a portion of the organic layer 408 is located between the main cathode layer 440 and the auxiliary cathode layer 410. In addition, the at least one tip structure 411 is also located between the main cathode layer 440 and the auxiliary cathode layer 410.

Figure 4D:
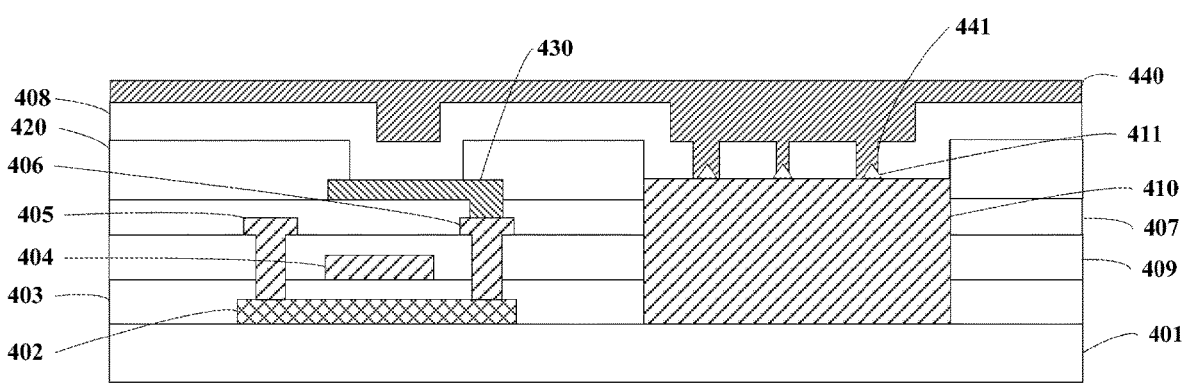

Next, as shown in FIG. 4D, a negative voltage (for example, the negative voltage may comprise a voltage of 0 V) is applied to the auxiliary cathode layer 410 and a positive voltage is applied to the main cathode layer 440. The organic layer 408 is broken down by discharging at the at least one tip structure 411. During the tip discharge, the main cathode layer 440 is melted at the at least one tip structure to form at least one connection 441 between the main cathode layer 440 and the auxiliary cathode layer 410, so that the main cathode layer 440 is electrically connected to the auxiliary cathode layer 410.

Heretofore, a manufacturing method of a display panel according to further embodiments of the present disclosure has been provided. In the manufacturing method, after the auxiliary cathode layer is formed, at least one bump on the auxiliary cathode layer is formed in the process of forming a pixel definition layer. The at least one bump serves as at least one tip structure. At least one connection is formed between the main cathode layer and the auxiliary cathode layer by discharging at the at least one tip structure, such that the main cathode layer is electrically connected to the auxiliary cathode layer. The process of this method is relatively simple and may improve the production efficiency and yield.

It should be noted that, in addition to forming the bump by using the pixel definition layer, the bump may also be formed by using a material of another insulating layer. In some embodiments, if a portion of an insulating layer is formed on the auxiliary cathode layer, the portion of the insulating layer may be etched to remain at least one bump and remove other portion of the insulating layer on the auxiliary cathode layer than the at least one bump. This makes it easier to break down the organic layer by tip discharge.

According to the above manufacturing method, a display panel according to further embodiments of the present disclosure is formed, as shown in FIG. 4D. The display panel shown in FIG. 4D differs from the display panel shown in FIG. 2D in that a material of the at least one tip structure 411 may comprise an insulating material. In the case where the material of the tip structure is the insulating material, the tip structure may also serve for tip discharge. As shown in FIG. 4D, the display panel may comprise a pixel definition layer 420. The material of the at least one tip structure 411 may comprise a material of the pixel definition layer 420.

FIGS. 5A through 5D are cross-sectional views illustrating structures of some stages in a manufacturing process of a display panel according still other embodiments of the present disclosure. The manufacturing process of the display panel according to still other embodiments of the present disclosure will be described in detail below with reference to FIGS. 5A through 5D.

Figure 5A:
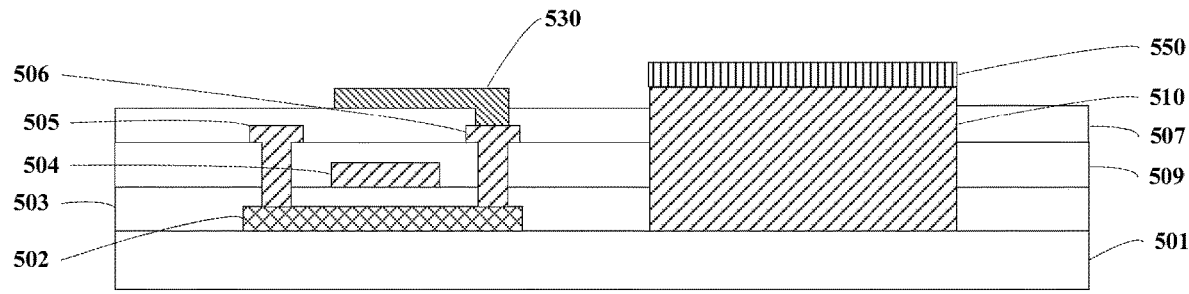
FIGS. 5A through 5D are cross-sectional views illustrating structures of some stages in a manufacturing process of a display panel according still other embodiments of the present disclosure.

First, as shown in FIG. 5A, a driving transistor is formed on a backplane glass 501. The driving transistor may comprise a semiconductor layer 502, a gate insulating layer 503, a gate 504, a source 505, and a drain 506. In addition, an interlayer insulating layer 509 and a passivation layer 507 may also be formed. Then, an anode layer 530 is formed.

In some embodiments, as shown in FIG. 5A, an auxiliary cathode layer 510 may be formed in the process of forming at least one of the gate 504, the source 505, or the drain 506. In other embodiments, the auxiliary cathode layer 510 may be formed in the process of forming the anode layer 530. The formation process of the auxiliary cathode layer 510 is similar to that described above and will not be described herein. For example, the auxiliary cathode layer 510 may be formed on the backplane glass 501. As another example, the auxiliary cathode layer 510 may be formed above the backplane glass 501.

Figure 5B:
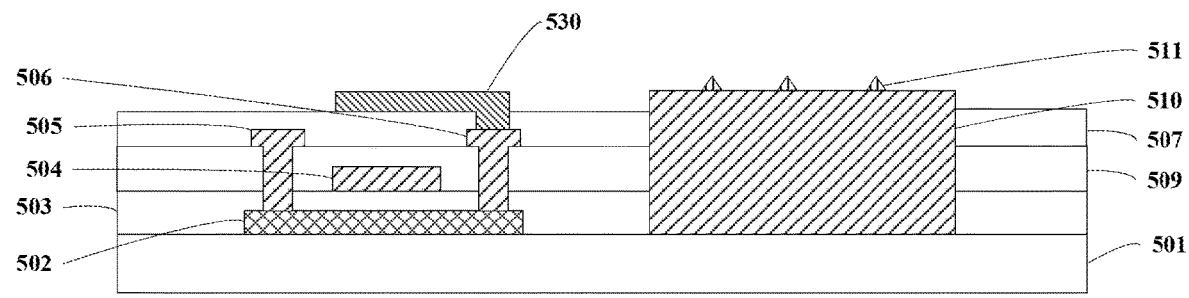

In some embodiments, at least one tip structure is formed on the auxiliary cathode layer. For example, as shown in FIG. 5A, a photoresist 550 is formed on the auxiliary cathode layer 510. Then, as shown in FIG. 5B, photolithography is performed on the photoresist 550 to form at least one bump 511. For example, some photoresist on the upper surface of the auxiliary cathode may be remained as the bumps during the peeling of the photoresist in the photolithography operation. These bumps serve as tip structures.

It should be noted that the photoresist may be a photoresist used in the formation of other structural layers after the auxiliary cathode layer is formed. For example, it may be a photoresist used during a process of etching the gate, the source, the drain, or the anode layer. Alternatively, the photoresist may be a separately formed photoresist. Therefore, the scope of embodiments of the present disclosure is not limited thereto.

Figure 5C:
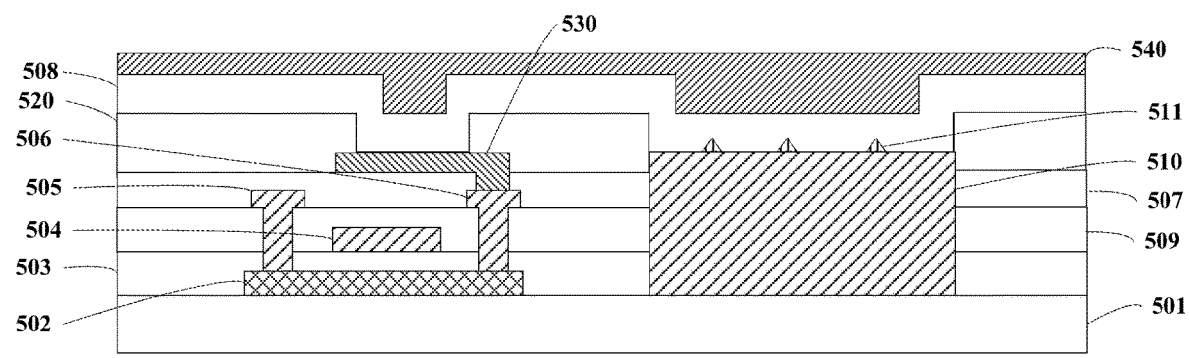

Next, as shown in FIG. 5C, a pixel definition layer 520 is formed. The pixel definition layer 520 exposes the anode layer 530 and the auxiliary cathode layer 510. It should be noted that if the at least one tip structure is not formed on the auxiliary cathode layer in the previous steps, it can be formed by a photoresist used for the photolithography of the pixel definition layer 520 in this process of forming the pixel definition layer 520.

Next, an organic layer 508 is formed. The organic layer 508 covers the anode layer 530 and the auxiliary cathode layer 510. For example, the organic layer 508 may comprise an electron injection layer, an electron transport layer, a light emitting layer, a hole transport layer, a hole injection layer, and the like. Then, a main cathode layer 540 is formed on a side of the organic layer 508 facing away from the auxiliary cathode layer. Thus, a portion of the organic layer 508 is located between the main cathode layer 540 and the auxiliary cathode layer 510. In addition, the at least one tip structure 511 is also located between the main cathode layer 540 and the auxiliary cathode layer 510.

Figure 5D:
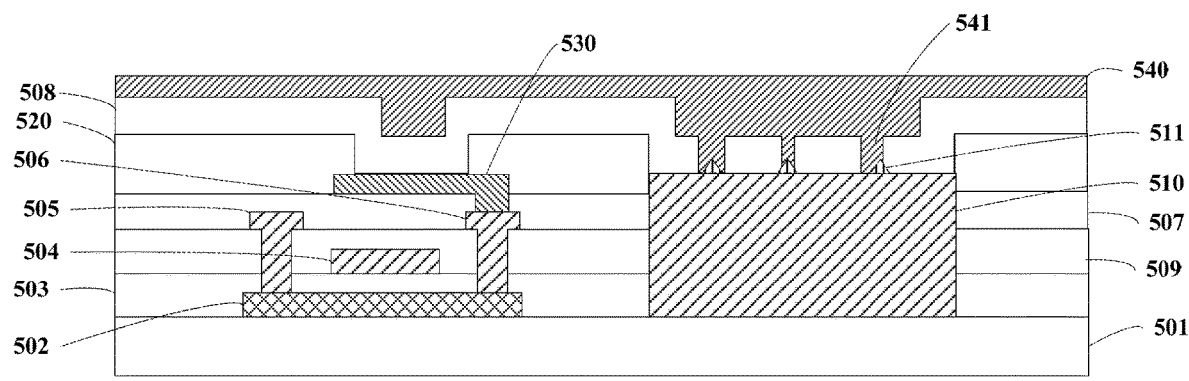

Next, as shown in FIG. 5D, a negative voltage (for example, the negative voltage may comprise a voltage of 0 V) is applied to the auxiliary cathode layer 510 and a positive voltage is applied to the main cathode layer 540. The organic layer 508 is broken down by discharging at the at least one tip structure 511. During the tip discharge, the main cathode layer 540 is melted at the at least one tip structure to form at least one connection 541 between the main cathode layer 540 and the auxiliary cathode layer 510, so that the main cathode layer 540 is electrically connected to the auxiliary cathode layer 510.

Heretofore, a manufacturing method of a display panel according to still other embodiments of the present disclosure has been provided. In the manufacturing method, at least one bump is formed on the auxiliary cathode layer by using a photoresist. The at least one bump serves as at least one tip structure. At least one connection is formed between the main cathode layer and the auxiliary cathode layer by discharging at the at least one tip structure, such that the main cathode layer is electrically connected to the auxiliary cathode layer. The process of the method is relatively simple and may improve the production efficiency and yield.

According to the above manufacturing method, a display panel according to still other embodiments of the present disclosure is formed, as shown in FIG. 5D. The display panel shown in FIG. 5D differs from the display panel shown in FIG. 2D in that a material of the at least one tip structure 511 may comprise a photoresist.

Some methods of forming a bump on the auxiliary cathode layer as a tip structure have been described above. However, those skilled in the art should understand that the method of forming the bump in embodiments of the present disclosure may not be limited to the above. For example, adjustment of parameters for a thin film process or etching process may result in the formation of bumps. Therefore, the scope of embodiments of the present disclosure is not limited thereto.

In other embodiments, the tip structure may comprise a corner of the auxiliary cathode layer.

Figure 6A:
FIGS. 6A through 6C are cross-sectional views illustrating structures of some stages in a manufacturing process of a display panel according to still other embodiments of the present disclosure.
Figure 6B:
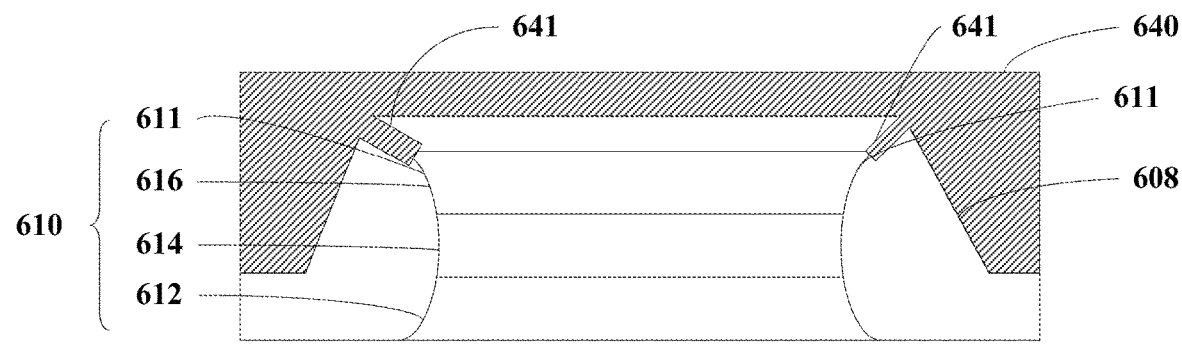
Figure 6C:
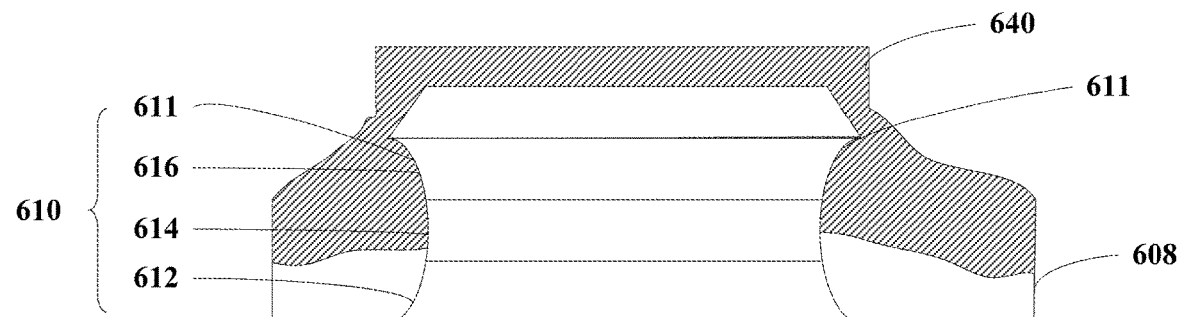

FIGS. 6A through 6C are cross-sectional views illustrating structures of some stages in a manufacturing process of a display panel according to still other embodiments of the present disclosure. The manufacturing process of the display panel according to still other embodiments of the present disclosure will be described in detail below with reference to FIGS. 6A through 6C.

First, as shown in FIG. 6A, an auxiliary cathode layer 610 is formed. The auxiliary cathode layer 610 may comprise a first auxiliary cathode layer 612, a second auxiliary cathode layer 614 on the first auxiliary cathode layer 612, and a third auxiliary cathode layer 616 on a side of the second auxiliary cathode layer 614 facing away from the first auxiliary cathode layer 612. For example, the first auxiliary cathode layer 612 may be a Mo layer, the second auxiliary cathode layer 614 may be an Al layer, and the third auxiliary cathode layer 616 may be a Mo layer. For example, the auxiliary cathode layer 610 may be formed in the process of forming a source and a drain (or a gate, an anode layer, etc.). In the formation process, material layers (for example, a Mo layer, an Al layer, and a Mo layer) are first deposited, and then the material layers are etched to form the source, the drain, and the auxiliary cathode layer. In the etching process, as shown in FIG. 6A, a side surface of the auxiliary cathode layer 610 is etched such that the side surface of the auxiliary cathode layer 610 is recessed to form the at least one tip structure 611. The tip structure 611 is the corner of the auxiliary cathode layer 610. As shown in FIG. 6A, the corner (i.e., the tip structure 611) is formed by the side surface and a top surface of the auxiliary cathode layer. For example, device parameters are adjusted during the etching process such that the auxiliary cathode layer is overetched and the side of the auxiliary cathode layer is etched by the chemical liquid to form the structure shown in FIG. 6A. Thus, tip structures are formed at four corners of the auxiliary cathode layer.

Next, as shown in FIG. 6B, an organic layer 608 is formed. The organic layer 608 covers the auxiliary cathode layer 610. Then, a main cathode layer 640 is formed on a side of the organic layer 608 facing away from the auxiliary cathode layer. Thus, a portion of the organic layer 608 is located between the main cathode layer 640 and the auxiliary cathode layer 610. Next, as shown in FIG. 6B, a negative voltage (for example, the negative voltage may comprise a voltage of 0 V) is applied to the auxiliary cathode layer 610 and a positive voltage is applied to the main cathode layer 640. The organic layer 608 is broken down by discharging at the at least one tip structure 611. During the tip discharge, the main cathode layer 640 is melted at the at least one tip structure to form at least one connection 641 between the main cathode layer 640 and the auxiliary cathode layer 610, so that the main cathode layer 640 is electrically connected to the auxiliary cathode layer 610.

Heretofore, a manufacturing method of a display panel according to still other embodiments of the present disclosure has been provided. In the manufacturing method, at least one corner of the auxiliary cathode layer is utilized as at least one tip structure. At least one connection is formed between the main cathode layer and the auxiliary cathode layer by discharging at the at least one tip structure, such that the main cathode layer is electrically connected to the auxiliary cathode layer. The process of the method is relatively simple and may improve the production efficiency and yield.

In other embodiments, as shown in FIG. 6C, during the formation of the organic layer 608 (and other insulating layers), the organic layer 608 (and other insulating layers) may break at the tip structure (i.e., a corner) of the auxiliary cathode layer 610. Therefore, the main cathode layer 640 may be electrically connected to the auxiliary cathode layer 610 during the subsequent formation of the main cathode layer 640. In such a case, the electrical connection between the main cathode layer and the auxiliary cathode layer can be realized even if tip discharge is not performed.

A display panel according to other embodiments of the present disclosure may be formed by the above manufacturing method. The display panel of this embodiment differs from the display panel described above in that the at least one tip structure may comprise a corner of the auxiliary cathode layer, as shown in FIG. 6B or FIG. 6C.

FIGS. 7A through 7D are cross-sectional views illustrating structures of some stages in a manufacturing process of a display panel according to still other embodiments of the present disclosure. The manufacturing process of the display panel according to still other embodiments of the present disclosure will be described in detail below with reference to FIGS. 7A through 7D.

Figure 7A:
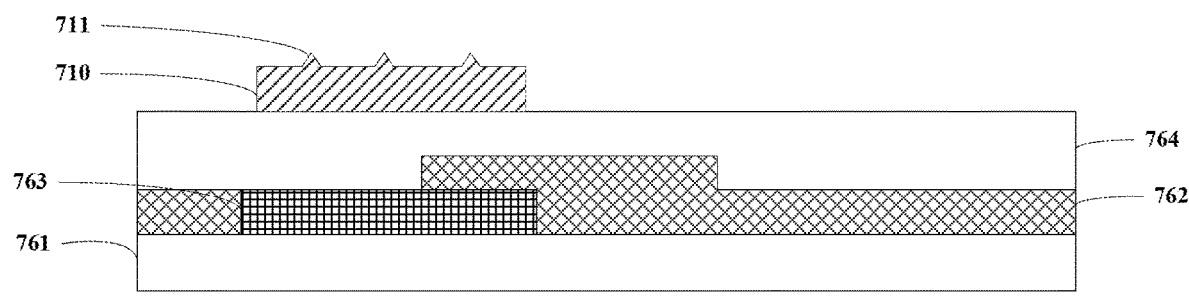
FIGS. 7A through 7D are cross-sectional views illustrating structures of some stages in a manufacturing process of a display panel according to still other embodiments of the present disclosure.

First, as shown in FIG. 7A, an auxiliary cathode layer 710 is formed over a cover glass 761. For example, a color filter (CF) 762 and a black matrix (BM) 763 are formed on the cover glass 761. A glue layer 764 is coated on the color filter 762 and the black matrix 763 (i.e., on a side of the color filter 762 and the black matrix 763 facing away from the cover glass). The glue layer 764 may be used for flattening. An auxiliary cathode layer 710 is then formed on a side of the glue layer 764 facing away from the color filter 762. For example, a material of the auxiliary cathode layer 710 may comprise at least one of a material of an anode layer or a material of an electrode of the driving transistor.

Then, at least one tip structure 711 is formed on the auxiliary cathode layer 710. For example, photolithography (such as incomplete exposure) and etching operations are performed on the auxiliary cathode layer, or an etching rate or the like is adjusted to form at least one bump. As another example, the at least one bump is formed using an insulating material such as a material of a pixel definition layer or a photoresist material. The at least one bump serves as at least one tip structure. For another example, a side of the auxiliary cathode layer is etched such that the side of the auxiliary cathode layer is recessed to make the corner of the auxiliary cathode layer form the tip structure. These methods may refer to the previous description, which will not described in detail herein.

In some embodiments, an auxiliary cathode pad electrode connected to the auxiliary cathode layer may also be formed, which is used to transmit a voltage to the auxiliary cathode layer.

Figure 7B:
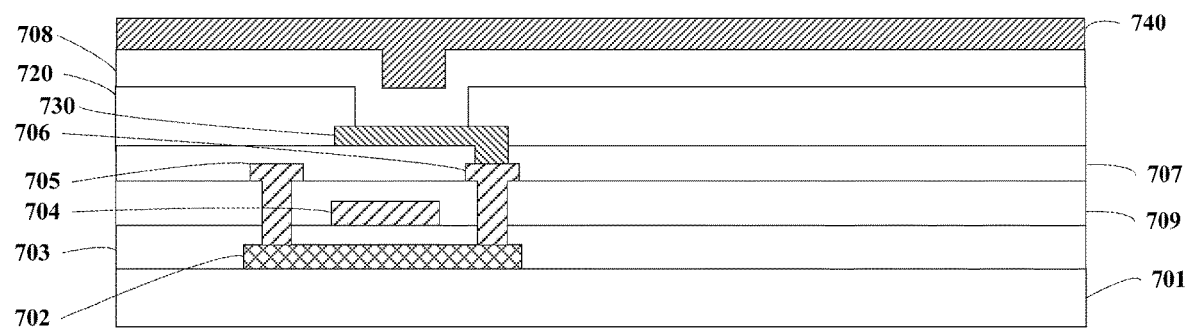

Next, as shown in FIG. 7B, a driving transistor is formed on the backplane glass 701. The driving transistor may comprise a semiconductor layer 702, a gate insulating layer 703, a gate 704, a source 705, and a drain 706. In addition, an interlayer insulating layer 709 and a passivation layer 707 may also be formed. An anode layer 730 connected to the drain 706 is then formed on the passivation layer 707. Next, a pixel definition layer 720 is formed, which exposes the anode layer 730. Then, an organic layer 708 is formed on the anode layer 730 and the pixel definition layer 720, and a main cathode layer 740 is formed on the organic layer 708. In addition, a main cathode pad electrode (not shown in FIG. 7B) connected to the main cathode layer 740 may be formed, which is used to transmit a voltage to the main cathode layer.

It should be noted that the order in which the structure shown in FIG. 7A and the structure shown in FIG. 7B are formed is not limited. For example, the structure shown in FIG. 7A may be formed before the formation of the structure shown in FIG. 7B. As another example, the structure shown in FIG. 7B may be formed before the formation of the structure shown in FIG. 7A. For another example, the structure shown in FIG. 7A and the structure shown in FIG. 7B may be simultaneously formed.

Figure 7C:
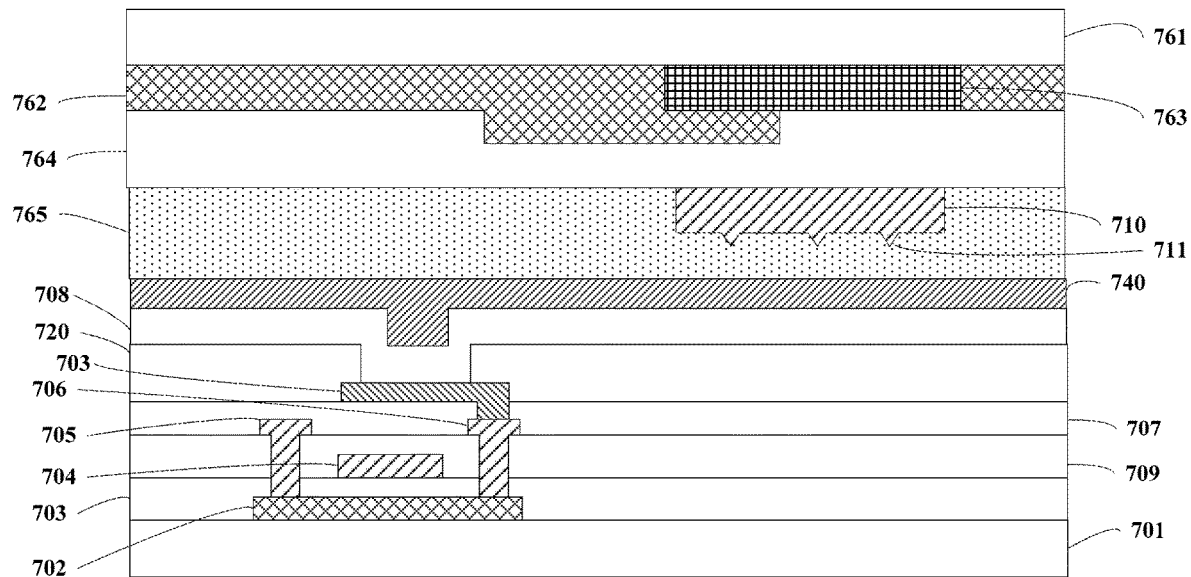

Next, as shown in FIG. 7C, the structure shown in FIG. 7A is butt jointed to the structure shown in FIG. 7B, and a filling layer 765 is formed between the two structures. Thus, a portion of the filling layer 765 is located between the main cathode layer 740 and the auxiliary cathode layer 710. Also, the at least one bump tip structure 711 is located between the main cathode layer 740 and the auxiliary cathode layer 710. The filling layer 765 may comprise a jellied encapsulating material, which functions to block moisture and oxygen, and prevent the organic layer from being eroded by the moisture and oxygen. A material of the filling layer is an insulating material.

Figure 7D:
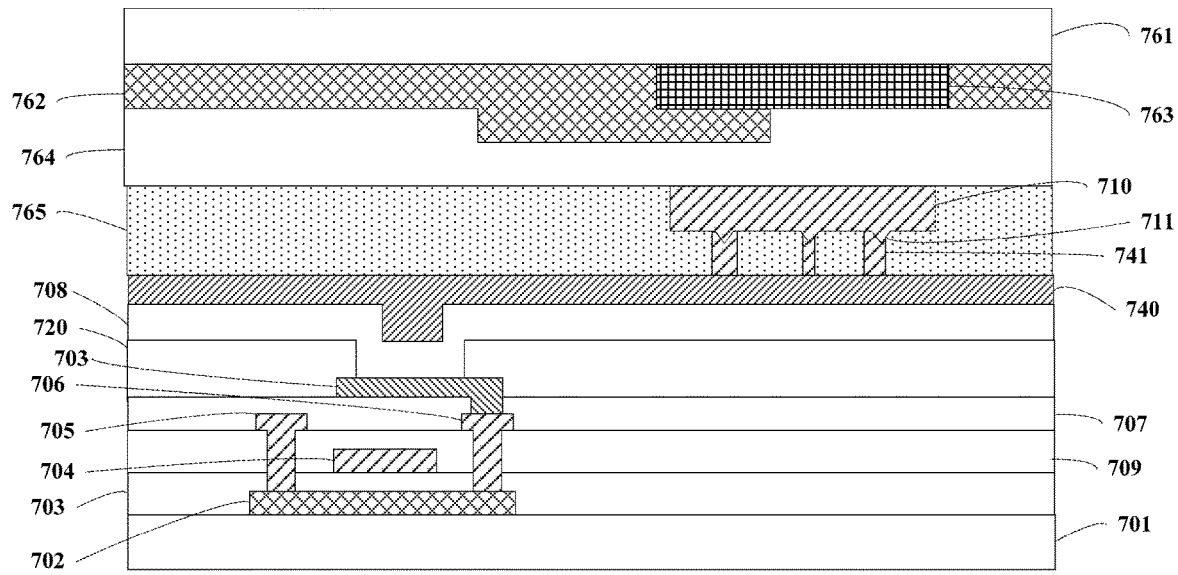

Next, as shown in FIG. 7D, a first voltage is applied to the main cathode layer and applying a second voltage to the auxiliary cathode layer. a polarity of the first voltage is opposite to a polarity of the second voltage. For example, the first voltage is a positive voltage and the second voltage is a negative voltage. That is, the negative voltage (e.g., the negative voltage may comprise a voltage of 0 V) is applied to the auxiliary cathode layer 710 and the positive voltage is applied to the main cathode layer 740. As another example, the first voltage is a negative voltage and the second voltage is a positive voltage. That is the positive voltage is applied to the auxiliary cathode layer 710 and the negative voltage (e.g., the negative voltage may comprise a voltage of 0 V) is applied to the main cathode layer 740. The filling layer 765 is broken down by discharging at the at least one tip structure 711. During the tip discharge, the auxiliary cathode layer 710 may melt at the at least one tip structure to form at least one connection 741 between the main cathode layer 740 and the auxiliary cathode layer 710, so that the main cathode layer 740 is electrically connected to the auxiliary cathode layer 710. Since the filling layer is relatively thick, the voltage difference may be appropriately increased (for example, the voltage difference may be approximately 50V to 60V) compared to the voltage difference in the previously described method, thereby facilitating breakdown of the filling layer.

Heretofore, a manufacturing method of a display panel according to still other embodiments of the present disclosure has been provided. In the manufacturing method, an auxiliary cathode layer is formed on a side of the cover glass. At least one tip structure is formed on the auxiliary cathode layer. A main cathode layer is formed on a side of the backplane glass. A filling layer is formed between the main cathode layer and the auxiliary cathode layer. At least one connection is formed between the main cathode layer and the auxiliary cathode layer by discharging at the at least one tip structure, such that the main cathode layer is electrically connected to the auxiliary cathode layer. The process of the method is relatively simple and may improve the production efficiency and yield.

According to the above manufacturing method, a display panel according to still other embodiments of the present disclosure is formed, as shown in FIG. 7D. The display panel comprises a backplane glass 701 and a cover glass 761 disposed opposite to the backplane glass 701. The main cathode layer 740 and the auxiliary cathode layer 710 are between the backplane glass 701 and the cover glass 761. In the display panel, an auxiliary cathode layer 710 is between the main cathode layer 740 and the cover glass 761.

In some embodiments of the present disclosure, a display device may also be provided. The display device may comprise a display panel as described above, such as the display panel shown in FIG. 2D, FIG. 3D, FIG. 4D, FIG. 5D or FIG. 7D.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified or equivalently substituted for part of the technical features without departing from the scope and spirit of the present disclosure. The scope of the disclosure is defined by the following claims.

What is claimed is:

1. A manufacturing method of a display panel, comprising:
   forming an auxiliary cathode layer;
   forming at least one tip structure on the auxiliary cathode layer;
   forming a main cathode layer, wherein the at least one tip structure is between the auxiliary cathode layer and the main cathode layer; and
   forming at least one connection between the main cathode layer and the auxiliary cathode layer by discharging at the at least one tip structure, wherein the at least one connection is electrically connected to the main cathode layer and the auxiliary cathode layer respectively, and the discharging at the at least one tip structure comprises:

applying a first voltage to the main cathode layer and applying a second voltage to the auxiliary cathode layer, a polarity of the first voltage being opposite to a polarity of the second voltage, or generating static electricity on the auxiliary cathode layer by using an electrostatic generation device, to discharge at the at least one tip structure.

2. The manufacturing method according to claim 1, wherein
the step of forming the at least one tip structure comprises: etching a side of the auxiliary cathode layer such that the side of the auxiliary cathode layer is recessed to form the at least one tip structure.

3. The manufacturing method according to claim 1, wherein
the auxiliary cathode layer is formed on a backplane glass before forming the main cathode layer; and
before forming the main cathode layer, the manufacturing method further comprises: forming an organic layer, a portion of the organic layer being located between the main cathode layer and the auxiliary cathode layer after the main cathode layer is formed;
wherein, the first voltage is a positive voltage, the second voltage is a negative voltage.

4. The manufacturing method according to claim 1, wherein
at least one of the first voltage or the second voltage is a voltage whose magnitude varies with time.

5. The manufacturing method according to claim 1, wherein the at least one tip structure comprises at least one bump.

6. The manufacturing method according to claim 5, further comprising:
forming a driving transistor comprising a gate, a source, and a drain before forming the main cathode layer,
wherein the auxiliary cathode layer is formed in a process of forming at least one of the gate, the source, or the drain, and a material of the auxiliary cathode layer comprises at least one of materials of the gate, the source, or the drain;
wherein, the step of forming the at least one tip structure comprises: forming the at least one bump by etching the auxiliary cathode layer.

7. The manufacturing method according to claim 5, further comprising:
forming an anode layer before forming the main cathode layer, the auxiliary cathode layer being formed in the process of forming the anode layer, and a material of the auxiliary cathode layer comprising a material of the anode layer;
wherein, the step of forming the at least one tip structure comprises: etching the auxiliary cathode layer with an adjustable etching rate to form the at least one bump.

8. The manufacturing method according to claim 5, further comprising:
forming a pixel definition layer after forming the auxiliary cathode layer, a portion of which is formed on the auxiliary cathode layer;
wherein, the step of forming the at least one tip structure comprises: etching the portion of the pixel definition layer on the auxiliary cathode layer to form the at least one bump.

9. The manufacturing method according to claim 5, wherein the step of forming the at least one tip structure comprises:
forming a photoresist on the auxiliary cathode layer; and
performing photolithography on the photoresist to form the at least one bump.

10. A display panel, comprising:
a main cathode layer;
an auxiliary cathode layer;
at least one tip structure on a surface of the auxiliary cathode layer close to the main cathode layer; and
at least one connection between the main cathode layer and the auxiliary cathode layer, electrically connected to the main cathode layer and the auxiliary cathode layer respectively, wherein the at least one connection covers the at least one tip structure;
wherein the at least one connection is formed by discharging at the at least one tip structure, and the discharging at the at least one tip structure comprises: applying a first voltage to the main cathode layer and applying a second voltage to the auxiliary cathode layer, a polarity of the first voltage being opposite to a polarity of the second voltage, or generating static electricity on the auxiliary cathode layer by using an electrostatic generation device, to discharge at the at least one tip structure.

11. The display panel according to claim 10, wherein
the at least one tip structure comprises a corner of the auxiliary cathode layer.

12. The display panel according to claim 10, wherein
a material of the at least one tip structure comprises a conductive material or an insulating material.

13. The display panel according to claim 10, wherein
the display panel further comprises an anode layer and a driving transistor;
wherein, a material of the at least one tip structure comprises at least one of a material of the anode layer or a material of an electrode of the driving transistor.

14. The display panel according to claim 10, wherein
the display panel further comprises a pixel definition layer, wherein a material of the at least one tip structure comprises a material of the pixel definition layer.

15. The display panel according to claim 10, further comprising:
a main cathode pad electrode connected to the main cathode layer; and
an auxiliary cathode pad electrode connected to the auxiliary cathode layer.

16. The display panel according to claim 10, wherein
the display panel further comprises: a backplane glass and a cover glass disposed opposite to the backplane glass, wherein the main cathode layer and the auxiliary cathode layer are between the backplane glass and the cover glass,
wherein the auxiliary cathode layer is between the main cathode layer and the backplane glass, or the auxiliary cathode layer is between the main cathode layer and the cover glass.

17. A display device, comprising: the display panel according to claim 10.

18. The display panel according to claim 10, wherein
the at least one tip structure comprises at least one bump.

19. The display panel according to claim 18, wherein
the at least one connection is a part of the main cathode layer.

* * * * *